United States Patent [19]

Jacobs et al.

[11] 4,423,379

[45] Dec. 27, 1983

[54] BATTERY TESTING TECHNIQUES

[75] Inventors: William R. Jacobs, Wilmete; Richard A. Karlin, Chicago, both of Ill.; Peter K. Sun, Hong Hong, Hong Kong

[73] Assignee: Sun Electric Corporation, Crystal Lake, Ill.

[21] Appl. No.: 249,359

[22] Filed: Mar. 31, 1981

[51] Int. Cl.³ .............................................. G01N 27/46
[52] U.S. Cl. .................................. 324/429; 324/430; 324/431; 340/636
[58] Field of Search ...................... 324/429, 430, 426; 320/48; 340/636

[56] References Cited

U.S. PATENT DOCUMENTS 3,680,072 7/1972 Charbonnier et al. ................ 320/48
4,302,714 11/1981 Yefsky .................................... 340/636
4,322,685 3/1982 Frailing et al. ....................... 324/429

Primary Examiner—Michael J. Tokar
Assistant Examiner—Kevin D. O'Shea
Attorney, Agent, or Firm—Allegretti, Newitt, Witcoff & McAndrews, Ltd.

[57] ABSTRACT

A system and method for testing a battery having an internal impedance by generating digital battery parameter values corresponding to the battery parameters at different points in time by means of current, voltage and temperature measurement circuits and an analog-to-digital converter. An electrical load is periodically placed on the battery and the battery is also charged between loadings in order to provide battery parameter values during different battery conditions. A microprocessor coordinates the testing of the battery and the measuring of the battery parameter values, as well as the calculation of test criteria based on those values in order to quickly and accurately analyze the condition of the battery.

28 Claims, 17 Drawing Figures

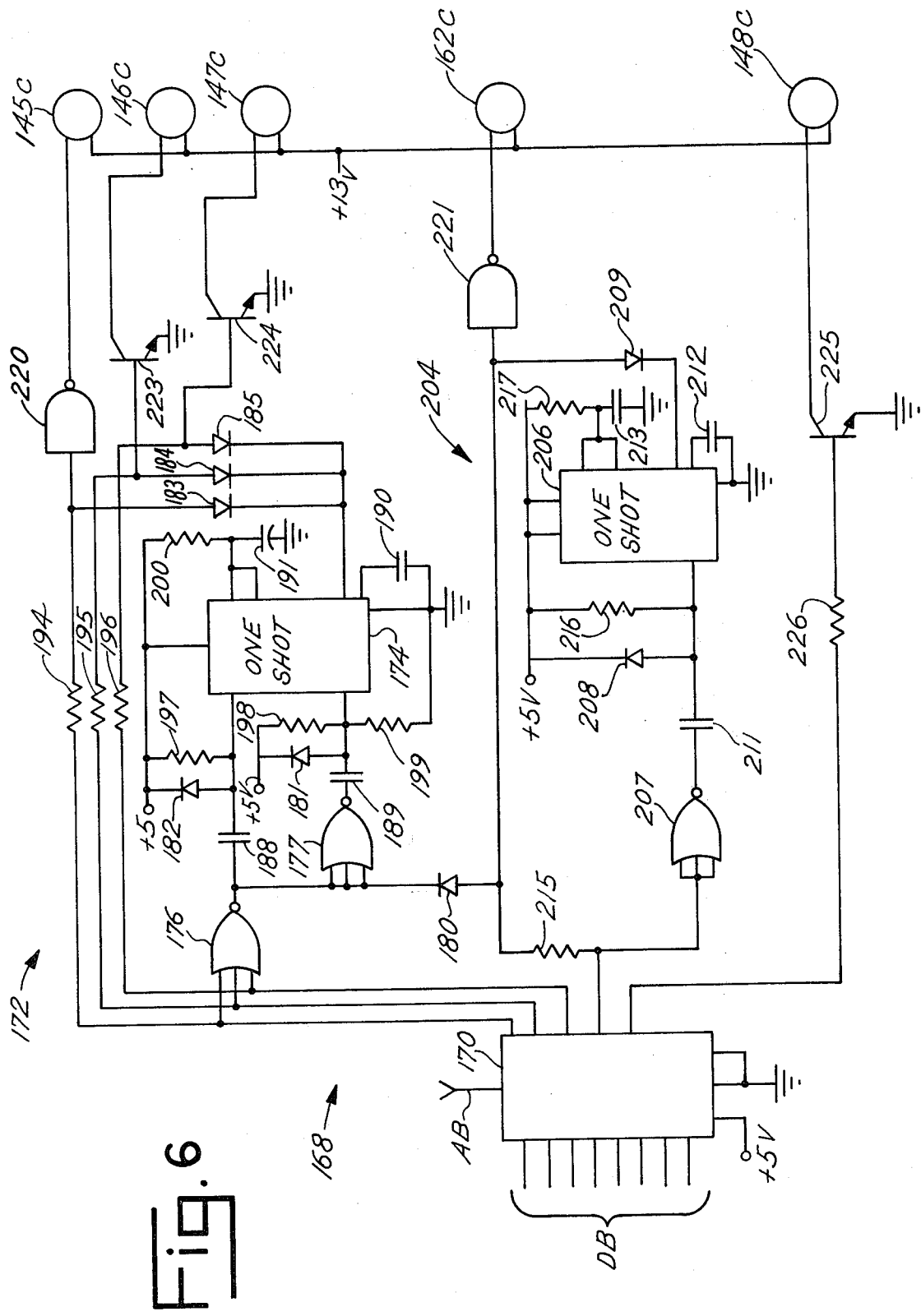

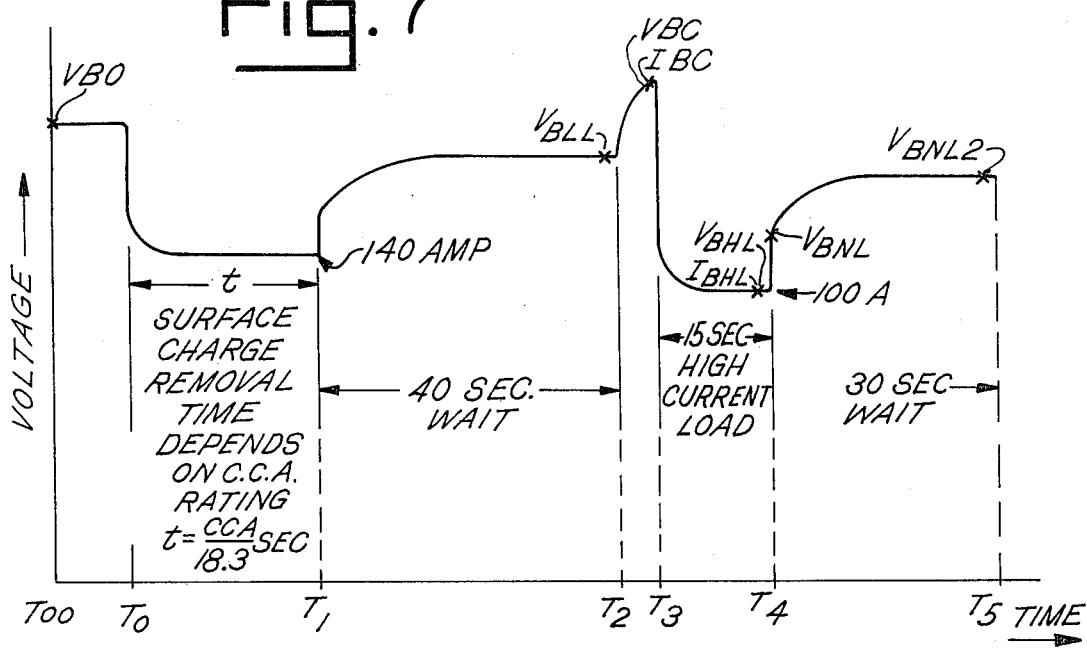
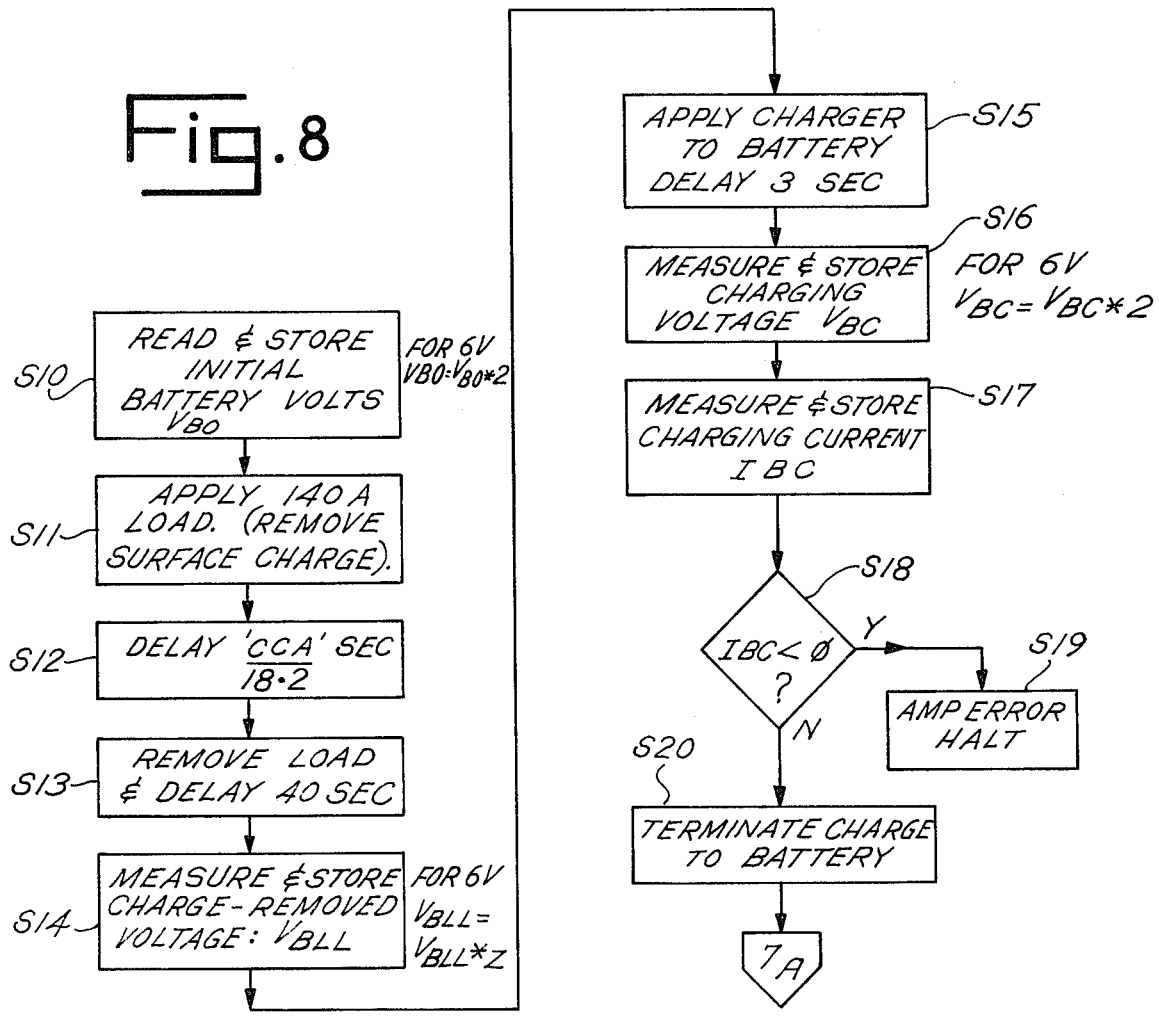

Fig. 13

|  | 0 | 1 | 2 | 3 | 4 | 5 | 6 | 7 | 8 | 9 | A | B | C | D | E | F | 10 | 11 | 12 | 13 | 14 | 15 | 16 | 17 |
|---|---|---|---|---|---|---|---|---|---|---|---|---|---|---|---|---|---|---|---|---|---|---|---|---|
| 400X |  | E | N | T | E | R |  | B | A | T | T | E | R | Y |  | D | A | T | A |  |  |  |  |  |
| 402X |  |  |  |  |  |  |  |  |  |  |  |  |  |  |  |  |  |  |  |  |  |  |  |  |
| 404X |  |  |  |  |  |  |  |  |  |  |  |  |  |  |  |  |  |  |  |  |  |  |  |  |
| 406X | V | O | L | T | S |  | ( | 6 |  | O | R |  | / | 2 | ) |  |  |  |  |  | * | * |  |  |
| 408X |  |  |  |  |  |  |  |  |  |  |  |  |  |  |  |  |  |  |  |  |  |  |  |  |
| 40AX | P | R | E | S | S |  | P | R | O | C | E | E | D |  |  |  |  |  |  |  |  |  |  |  |
| 40CX |  |  |  |  |  |  |  |  |  |  |  |  |  |  |  |  |  |  |  |  |  |  |  |  |
| 40EX |  |  |  |  |  |  |  |  |  |  |  |  |  |  |  |  |  |  |  |  |  |  |  |  |
| 410X |  |  |  |  |  |  |  |  |  |  |  |  |  |  |  |  |  |  |  |  |  |  |  |  |

Fig. 14

|  | 0 | 1 | 2 | 3 | 4 | 5 | 6 | 7 | 8 | 9 | A | B | C | D | E | F | 10 | 11 | 12 | 13 | 14 | 15 | 16 | 17 |
|---|---|---|---|---|---|---|---|---|---|---|---|---|---|---|---|---|---|---|---|---|---|---|---|---|
| 400X |  | E | N | T | E | R |  | B | A | T | T | E | R | Y |  | D | A | T | A |  |  |  |  |  |
| 402X |  |  |  |  |  |  |  |  |  |  |  |  |  |  |  |  |  |  |  |  |  |  |  |  |
| 404X | V | O | L | T |  | ( | 6 |  | O | R |  | / | 2 | ) |  |  |  |  |  |  | / | 2 |  |  |
| 406X |  |  |  |  |  |  |  |  |  |  |  |  |  |  |  |  |  |  |  |  |  |  |  |  |
| 408X | C | O | L | D |  | C | R | A | N | K |  | A | M | P | S |  |  |  |  |  | * | * | * |  |
| 40AX |  |  |  |  |  |  |  |  |  |  |  |  |  |  |  |  |  |  |  |  |  |  |  |  |
| 40CX | P | R | E | S | S |  | P | R | O | C | E | E | D |  |  |  |  |  |  |  |  |  |  |  |
| 40EX |  |  |  |  |  |  |  |  |  |  |  |  |  |  |  |  |  |  |  |  |  |  |  |  |
| 410X |  |  |  |  |  |  |  |  |  |  |  |  |  |  |  |  |  |  |  |  |  |  |  |  |

Fig. 15

|      | 0 | 1 | 2 | 3 | 4 | 5 | 6 | 7 | 8 | 9 | A | B | C | D | E | F | 10 | 11 | 12 | 13 | 14 | 15 | 16 | 17 |
|------|---|---|---|---|---|---|---|---|---|---|---|---|---|---|---|---|----|----|----|----|----|----|----|----|
| 400X |   |   |   |   |   |   |   | R | E | S | U | L | T | S |   |   |    |    |    |    |    |    |    |    |
| 402X | B | A | T | T | E | R | Y |   | I | S |   | D | I | S | C | H | A  | R  | G  | E  | D  |    |    |    |
| 404X | C | H | A | R | G | E |   | A | N | D |   | R | E | T | E | S | T  |    |    |    |    |    |    |    |
| 406X |   |   |   |   |   |   |   |   |   |   |   |   |   |   |   |   |    |    |    |    |    |    |    |    |
| 408X |   |   |   |   |   |   |   |   |   |   |   |   |   |   |   |   |    |    |    |    |    |    |    |    |
| 40AX |   |   |   |   |   |   |   |   |   |   |   |   |   |   |   |   |    |    |    |    |    |    |    |    |
| 40CX |   |   |   |   |   |   |   |   |   |   |   |   |   |   |   |   |    |    |    |    |    |    |    |    |
| 40EX | P | R | E | S | S |   | P | R | O | C | E | E | D |   |   |   |    |    |    |    |    |    |    |    |
| 410X |   |   |   |   |   |   |   |   |   |   |   |   |   |   |   |   |    |    |    |    |    |    |    |    |

Fig. 16

|      | 0 | 1 | 2 | 3 | 4 | 5 | 6 | 7 | 8 | 9 | A | B | C | D | E | F | 10 | 11 | 12 | 13 | 14 | 15 | 16 | 17 |
|------|---|---|---|---|---|---|---|---|---|---|---|---|---|---|---|---|----|----|----|----|----|----|----|----|
| 400X |   |   |   |   |   |   |   | R | E | S | U | L | T | S |   |   |    |    |    |    |    |    |    |    |
| 402X | B | A | T | T | E | R | Y |   | I | S |   | B | A | D |   |   |    |    |    |    |    |    |    |    |
| 404X | C | H | A | R | G | E |   | L | E | V | E | L | : |   | Ø | Ø |    |    |    |    |    |    |    |    |
| 406X |   |   |   |   |   |   |   |   |   |   |   |   |   |   |   |   |    |    |    |    |    |    |    |    |
| 408X |   |   |   |   |   |   |   |   |   |   |   |   |   |   |   |   |    |    |    |    |    |    |    |    |
| 40AX |   |   |   |   |   |   |   |   |   |   |   |   |   |   |   |   |    |    |    |    |    |    |    |    |
| 40CX |   |   |   |   |   |   |   |   |   |   |   |   |   |   |   |   |    |    |    |    |    |    |    |    |
| 40EX |   |   |   |   |   |   |   |   |   |   |   |   |   |   |   |   |    |    |    |    |    |    |    |    |
| 410X |   |   |   |   |   |   |   |   |   |   |   |   |   |   |   |   |    |    |    |    |    |    |    |    |

Fig. 17

| | 0 | 1 | 2 | 3 | 4 | 5 | 6 | 7 | 8 | 9 | A | B | C | D | E | F | 10 | 11 | 12 | 13 | 14 | 15 | 16 | 17 |
|---|---|---|---|---|---|---|---|---|---|---|---|---|---|---|---|---|---|---|---|---|---|---|---|---|
| 400X | | | | | | | | | R | E | S | U | L | T | S | | | | | | | | | |
| 402X | B | A | T | T | E | R | Y | | I | S | | G | O | O | D | | | | | | | | | |
| 404X | C | H | A | R | G | E | | L | E | V | E | L | | X | X | % | | | | | | | | |
| 406X | | | | | | | | | | | | | | | | | | | | | | | | |
| 408X | | | | | | | | | | | | | | | | | | | | | | | | |
| 40AX | | | | | | | | | | | | | | | | | | | | | | | | |
| 40CX | | | | | | | | | | | | | | | | | | | | | | | | |
| 40EX | | | | | | | | | | | | | | | | | | | | | | | | |
| 410X | | | | | | | | | | | | | | | | | | | | | | | | |

BATTERY TESTING TECHNIQUES

BACKGROUND AND SUMMARY OF THE INVENTION

This invention relates to battery testing techniques, and more specifically relates to automated apparatus and methods for testing and evaluating conventional lead storage batteries.

In the past, lead storage batteries have been tested by a variety of manual techniques which basically consist of charging the battery and then measuring the voltage after a predetermined load has been placed on the battery. Experience has shown that this technique results in defective batteries being passed and acceptable batteries being rejected Difficulties in separating defective from acceptable batteries have been encountered with warranty programs which typically extend over several months or years of use by a customer. Customers bring in batteries for warranty service in various states of charge and condition resulting from many different types of use. Prior testing techniques were incapable of separating good batteries from bad ones, and also were more expensive or lengthy than customers would tolerate. The tests also required too much discretion on the part of service personnel.

Basically, the applicants have discovered that a battery can be quickly and accurately analyzed by operating it in a charge-discharge cycle of operation, generating battery parameter values corresponding to the battery parameters at different points in time during the charge-discharge cycle of operation, storing the battery parameter values, calculating the condition of the battery based on the stored parameter values and displaying the calculated results. Preferably, the battery is discharged both before and after it is charged in order to provide battery parameter values under different conditions which enable accurate diagnosis of the battery.

As explained in detail in the specification, the applicants have discovered various combinations of battery parameters, such as voltage, current or temperature, by which the condition of a battery can be accurately determined. Each of these unique features can be understood from the following description of the preferred embodiment. By using the described techniques, batteries can be quickly and economically diagnosed with a degree of accuracy previously unattained.

DESCRIPTION OF THE DRAWINGS

These and other advantages and features of the invention will appear for purposes of illustration, but not of limitation , in connection with the accompanying drawings, wherein like numbers refer to like parts throughout, and wherein:

FIG. 6 is a preferred form of relay driver used in connection with the preferred embodiment;

FIG. 7 is an exemplary graph of the voltage appearing across a typical battery during a test performed according to the preferred embodiment;

FIGS. 8-12 are flow charts describing the program listing carried out by the preferred embodiment; and FIGS. 13-17 are typical instructions or battery conditions displayed to the operator of the preferred embodiment during the battery testing.

DESCRIPTION OF THE PREFERRED EMBODIMENT

Figure 2:
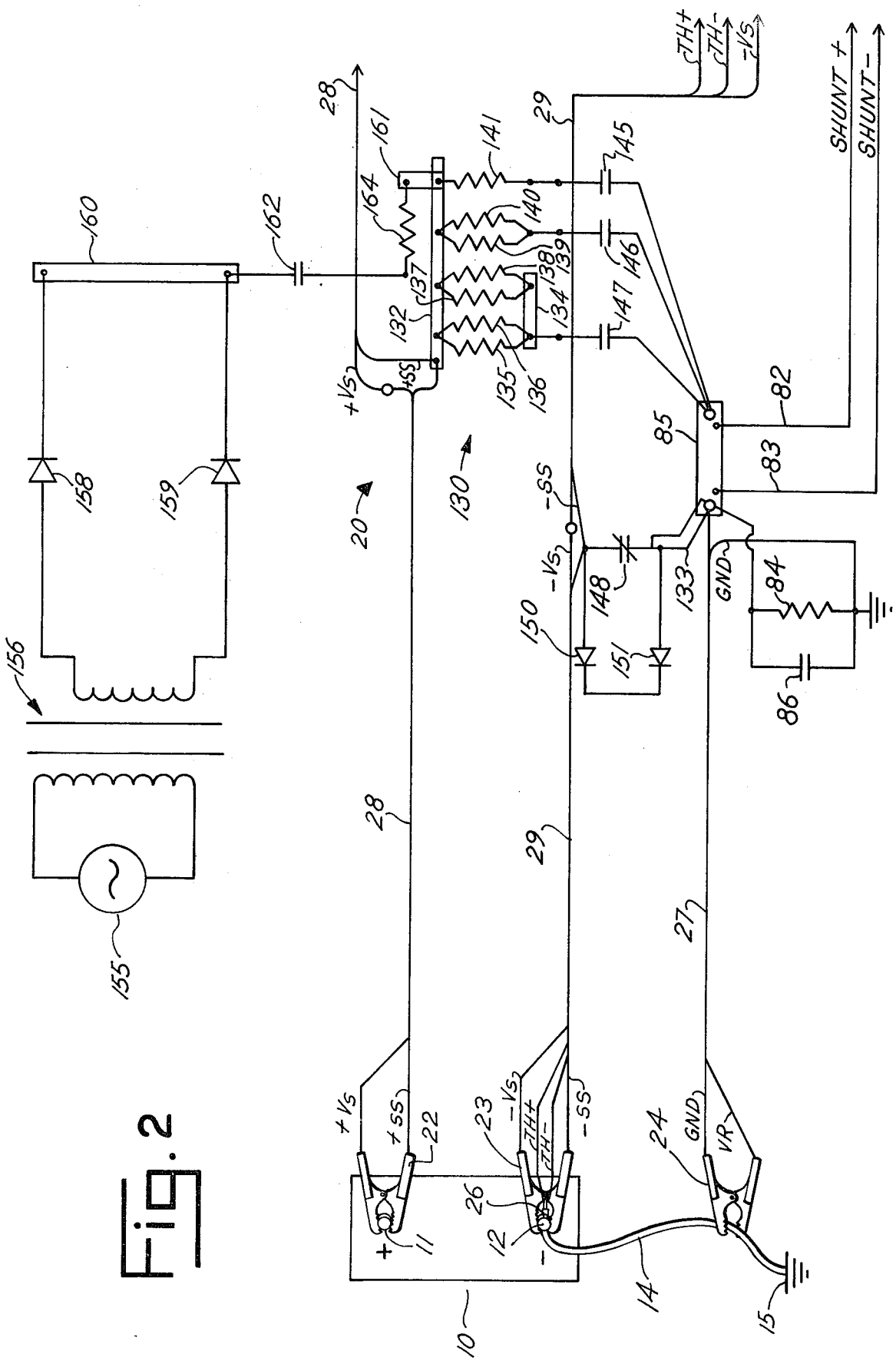
FIG. 2 is an electrical schematic diagram of a portion of the apparatus used to interconnect a battery with the preferred embodiment.

Referring to FIG. 2, the preferred embodiment is capable of analyzing the condition of a conventional lead storage battery 10 comprising a positive terminal 11 and a negative terminal 12. The negative terminal is connected to vehicle chassis ground 15 through a cable 14.

Referring to the drawings collectively, a preferred form of battery analyzing apparatus made in accordance with the preferred embodiment basically comprises a converter system 20, a loading and charging system 130, a display system 230, a data entry system 240 and a processor system 250.

Referring to FIG. 2, converter system 20 is used to convert battery parameters, such as battery voltage, battery current and battery temperature, into corresponding digital values. Battery voltage is the difference in potential between the positive and negative terminals of battery 10, and battery current is the current flowing through the battery between those terminals. System 20 comprises clamps 22-24 which are connected to positive terminal 11, negative terminal 12 and cable 14, respectively. A thermal sensor 26 is located on one jaw of clamp 23 so that a portion of the sensor is in contact with terminal 12 when the jaws are correctly placed on the terminal. The clamps are connected to other portions of the circuitry through multiconductor cables 27-29.

Figure 3:
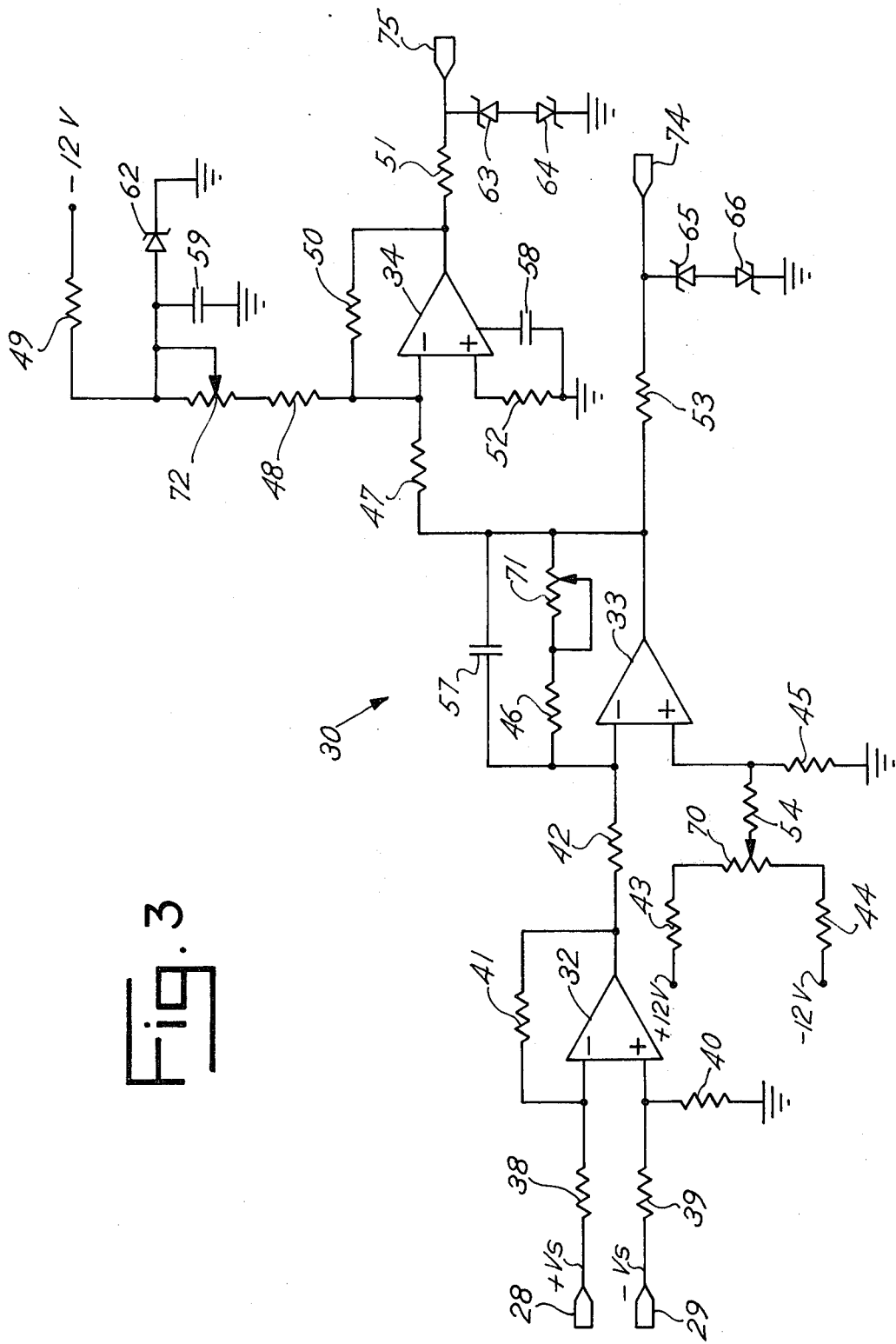
FIG. 3 is an electrical schematic diagram of a preferred form of voltage measurement circuit used in connection with the preferred embodiment.

Referring to FIG. 3, converter system 20 also includes a voltage measurement circuit 30 comprising operational amplifiers 32-34, resistors 38-54, capacitors 57-59, Zener diodes 62-66, and potentiometers 70-72 connected as shown. Potentiometer 70 controls the zero offset voltage conducted to operational amplifier 33, and potentiometer 71 controls the gain of that amplifier. Zener diodes 63-66 and resistors 51 and 53 are connected as voltage clamps to prevent saturation of the following stages of circuitry. Resistors 48, 49, potentiometer 72 and Zener diode 62 provide an offset voltage for the summing junction of a high gain amplifier composed of operational amplifier 34 and resistors 47 and 50-52. Amplifier 34 provides a high resolution voltage output on terminal 75 that is centered at the battery voltage. A voltage proportional to the battery voltage is also produced an output terminal 74.

Figure 4:
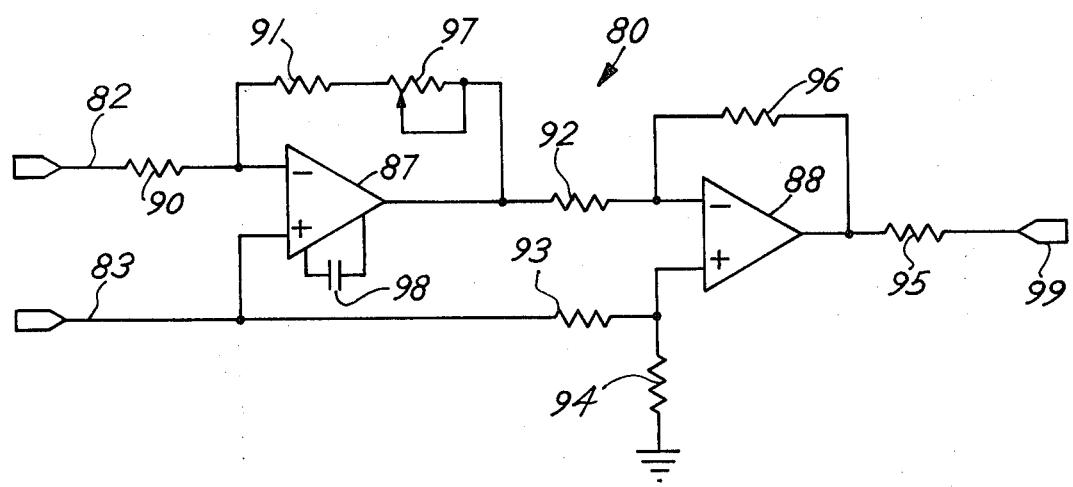
FIG. 4 is an electrical schematic diagram of a preferred form of current measurement circuit used in connection with the preferred embodiment.

Referring to FIG. 4, system 20 also comprises a current measurement circuit 80. The circuit includes conductors 82, 83, a resistor 84 and a capacitor 86 which are connected to a shunt resistor 85 (FIG. 2) which develops a voltage proportional to the current flowing through the battery. The circuit also includes operational amplifiers 87, 88, resistors 90-96, a potentiometer 97 and a capacitor 98. Output terminal 99 produces a voltage proportional to the current flowing through the battery. Resistors 90, 91 and 97 set the gain of the differential voltage across shunt resistor 85.

Figure 5:
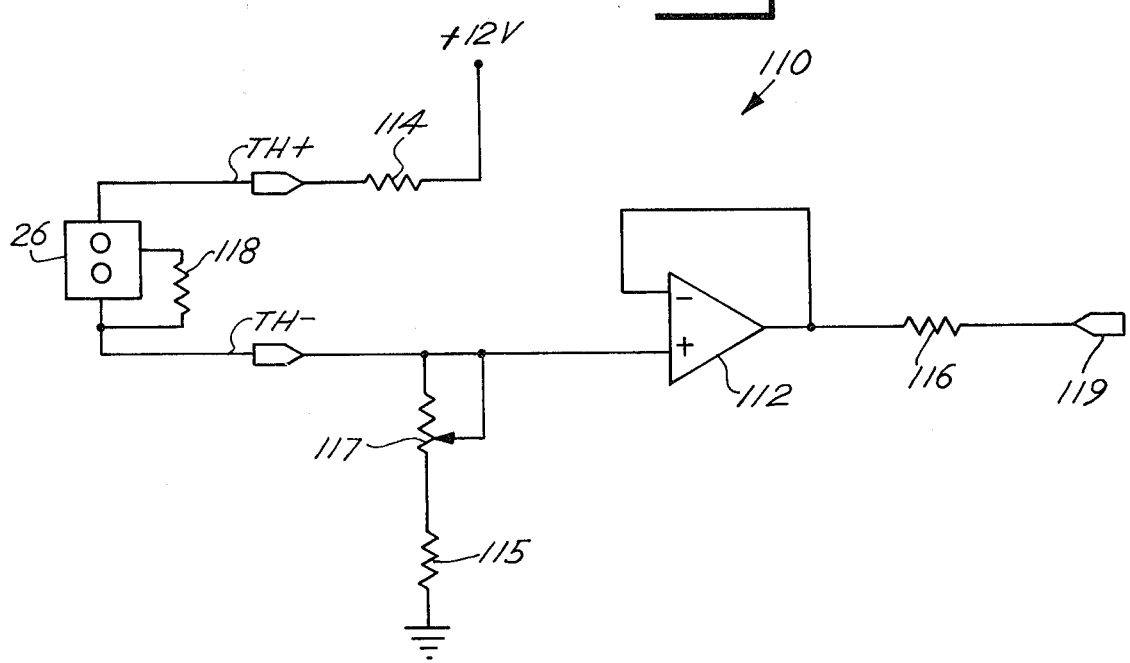
FIG. 5 is an electrical schematic diagram of a preferred form of temperature measurement circuit used in connection with the preferred embodiment.
Figure 9:
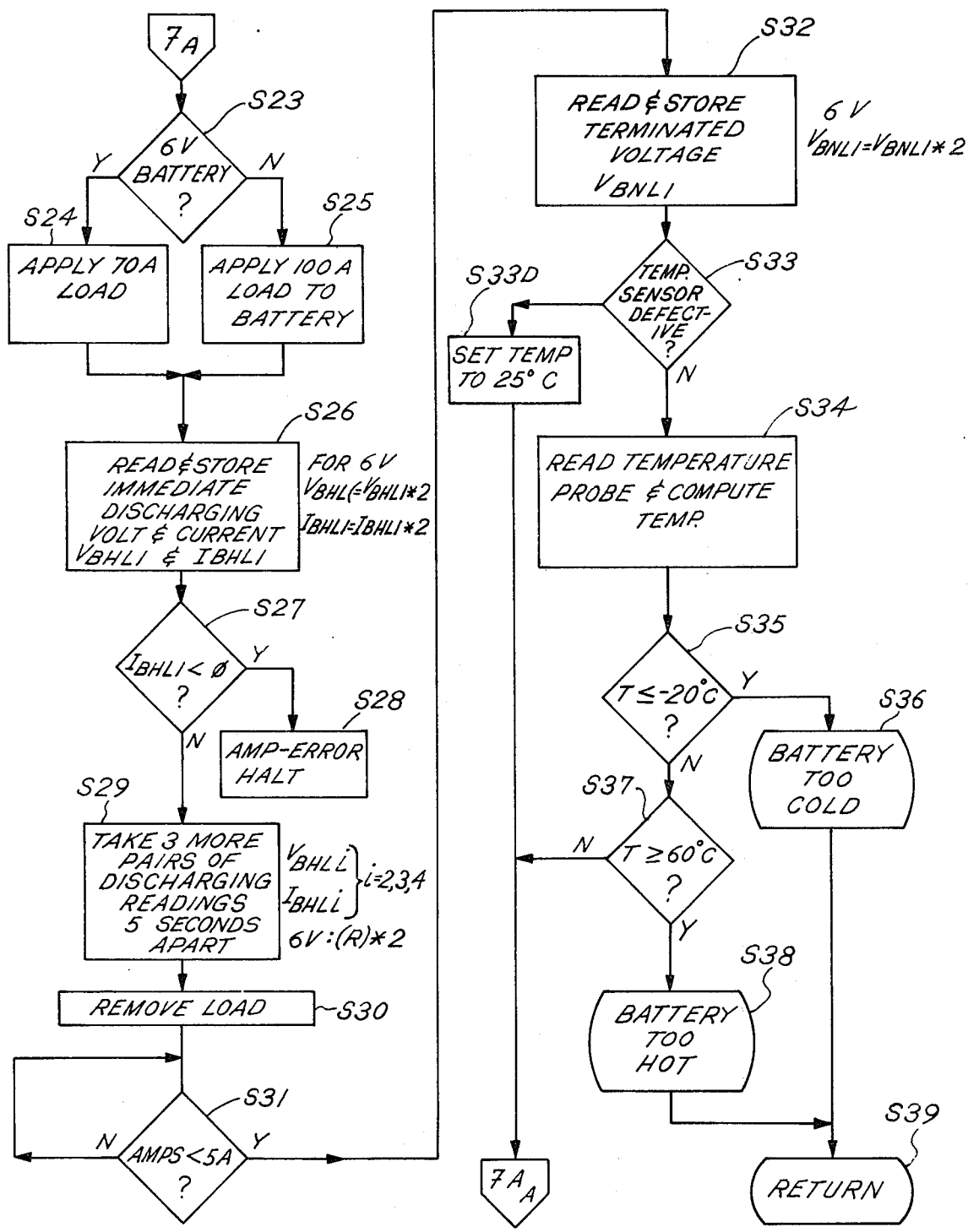

Referring to FIG. 5, system 20 also includes a temperature measurement circuit 110 comprising thermal sensor 26 located on one jaw of clamp 23 (FIG. 2). Circuit 110 also includes an operational amplifier 112 connected as a high input impedance voltage follower, resistors 114–116, a potentiometer 117 and an output terminal 119 which produces a voltage proportional to the temperature of the negative terminal of the battery.

Thermal sensor 26 is a constant current source. A constant current source is used to minimize any error which might tend to be introduced by the length of the wiring to the sensor. Its output changes in proportion to the absolute temperature of the battery. The current flowing through source 26 is converted to voltage by resistor 115 and potentiometer 117. The voltage is buffered by the high input impedance of operational amplifier 112. Potentiometer 117 can be adjusted to trim the slope of the circuit, and resistor 118 controls the sensor current.

Figure 1:
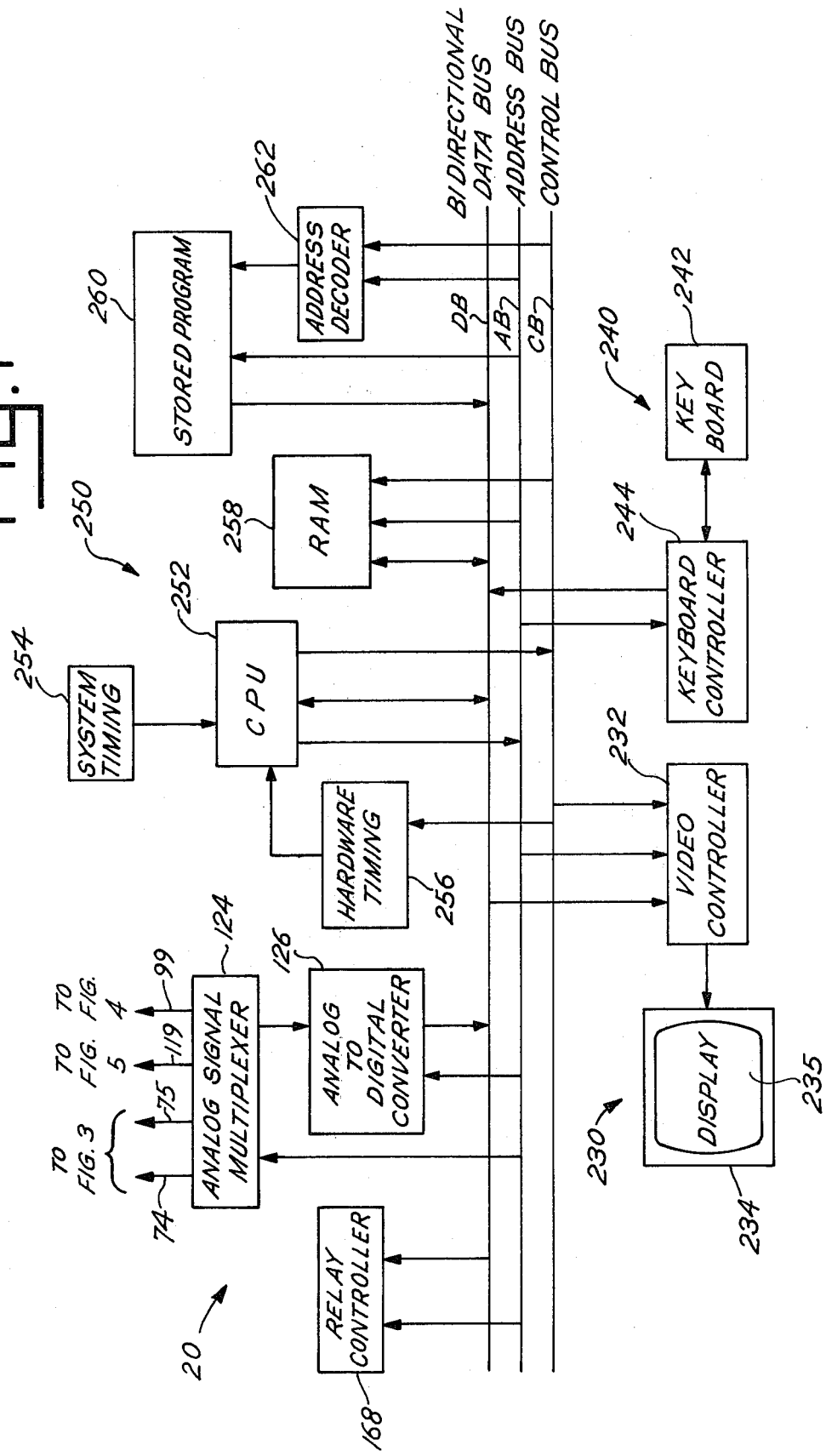
FIG. 1 is a schematic block diagram of a preferred form of battery testing apparatus made in accordance with the preferred embodiment of the invention.

Referring to FIG. 1, system 20 also includes a conventional analog signal multiplexer 124 and an analog-to-digital converter 126. Representative multiplexers and converters are shown as components 1350 and 1352 in U.S. Pat. No. 4,125,894 (Cashel et al.—Nov. 14, 1978). Such components are well known in the art. Multiplexer 124 samples the voltage, current and temperature measurement circuit outputs one-at-a-time and transmits them to analog-to-digital converter 126. Converter 126 transforms the analog voltage received from the multiplexer into a corresponding digital voltage which can be processed by processor system 250.

Referring to FIG. 2, loading and charging system 130 comprises apparatus for discharging battery 10 by placing an electrical load on the battery and for charging battery 10 from a rectified current source. The loading of the battery is achieved by copper straps 132–134 and 0.6 ohm resistors 135–141. System 130 also includes normally-open relay contacts 145–147 and normally-closed relay contacts 148, as well as diodes 150–151.

Still referring to FIG. 2, the charging of the battery is achieved by a 120 volt power source 155, a transformer 156, rectifying diodes 158, 159, copper straps 160, 161, a relay contact 162 and a 0.5 ohm resistor 164.

Referring to FIG. 6, contacts 145–148 and 162 are operated by relay controller 168 which includes relay coils 145C–148C and 162C corresponding to the like numbered contacts. Relay controller 168 includes a latch circuit 170 comprising five flip-flops, a discharge timer 172 and a charging timer 204.

Timer 172 comprises a one shot multivibrator 174, NOR gates 176, 177, diodes 180–185, capacitors 188–191 and resistors 194–200, connected as shown. Timer 204 comprises a one shot multivibrator 206, a NOR gate 207, diodes 208, 209, capacitors 211–213 and resistors 215–218, connected as shown.

Relay coils 145C and 162C are driven by NAND gates 220, 221, and relay coils 146C, 147C and 148C are driven by transistors 223–225. Transistor 225 is biased by a resistor 226.

Relay controller 168 enables the tester to put a load on the battery or to charge the battery under microprocessor control. The microprocessor addresses latches 170 through address bus AB, thus latching the contents of data bus DB which controls relay coils 145C–148C and 162C. The apparatus is protected against overheating when loads are left on accidentially by discharge timer 172 and charging timer 204. When a relay coil is energized, the one shot multivibrator resets, and if the relay coil is still energized when the one shot changes state, the relay coil will be disabled. Charging timer 204 is interlocked to the discharge timer 172 so that the battery cannot be charged while the load resistors are connected to the battery.

Referring to FIG. 1, display system 230 comprises a video controller 232 and a display monitor 234, including a face 235. The use of video controllers and display monitors in automotive test equipment is known. For example, a video controller 1800 and display monitor 190 are disclosed in the above-identified Cashell et al patent.

Referring to FIG. 1, data entry system 240 comprises a keyboard 242 and a keyboard controller 244. Use of a keyboard and associated controller are also known in the art. For exmaple, a keyboard 184 and controller are shown in FIGS. 17B and 17C of the above-identified Cashell at al Patent.

Referring to FIG. 1, processor system 250 comprises a central processing unit 252, a system timing circuit 254, a hardware timing circuit 256, a random access memory 258, a read only memory containing a stored program 260 and an address decoder 262. The central processing unit preferably comprises a model MC 6802 microprocessor manufactured by Motorola Corporation. It is an eight bit parallel processor with a built-in system clock generator and 128 bytes of random access memory for temporarily storing values.

Overall system management and data processing in controlled by CPU 252. The CPU receives input from various battery parameter measuring circuits and manipulates the data to make decisions for system control and handling.

The status of keyboard 242 is periodically monitored to determine the type of battery being tested and interfaced to the operator by means of alpha numeric displays on display monitor 234.

As shown in FIG. 1, the CPU treats the data parameter inputs and relay controller as peripheral devices which are interconnected by means of a processing bus including an eight bit bi directional data bus DB, a 16 bit address bus AB and a control bus CB. The control bus coordinates communications by transmitting a system clock signal, a read/write select signal, hardware generated interrupt signal reset and various timing signals. The system clock within the CPU is divided to generate a one millisecond clock signal for timing and interrupt purposes. A D-type flip-flop is clocked every millsecond and the output is tied to the $\overline{\text{INT}}$ of the CPU to initiate the interrupt handler to perform various housekeeping and data up-date functions. The flip-flop is reset at the end of the interrupt routine when the flip-flop is addressed. Hardware timing circuit 256 includes a deadman detector circuit which monitors the interrupt signal in order to reinitialize the processor if the interrupt signal misbehaves, thereby indicating a nonrecoverable system malfunction. Use of central processing units, system timing circuits and hardware timing circuits are well known in the art and an exemplary arrangement for automotive test equipment is described in detail in the above-indentified Cashell et al patent which is incorporated by reference.

OPERATION

The apparatus described above is operated by a program stored in read only memory 260. The program enables the processor system to efficiently and accurately determine the condition of the battery. FIG. 7 discloses a typical voltage waveform for an exemplary lead storage battery which is subjected to the tests performed under the control of the processor system.

Briefly, the operator must enter the battery voltage rating (e.g., 12 volt or 6 volt), and the battery cold crank rating into the system by means of keyboard 242. The operator then connects clamps 22–24 to the battery terminals and vehicle ground cable as shown in FIG. 2. At time Too, the processor reads and stores an initial voltage value, VBO (FIG. 7). From time To to T1, the surface charge of the battery is removed by applying a 140 amp resistor load for a time determined by the cold crank rating of the battery. At time T1, the resistor load is removed, and a delay or wait period of 40 seconds takes place from time T1 to time T2. At the end of the wait period, the charge removed battery voltage, VBLL, is read and stored by the processor system. The time periods from T00 to T2 comprise a first portion of time for testing the battery. From time T2 to time T3, the battery is charged and the charging voltage and current, VBC and IBC, are read and stored. The time T2 to T3 comprises a second portion of time for testing the battery.

Between times T3 and T4, the battery is subjected to a heavy current load test which determines the battery's capability of delivering a large current and also helps to measure the internal impedance of the battery. At time T3, as soon as the load is applied to the battery, initial voltage and current discharging values (VBHL1 and IBHL1) are stored by the processor system 250. Three additional discharging voltage and current values are stored at five second intervals from time T3 to T4. At the end of time T4, after 15 seconds of discharge, the load is removed from the battery and a terminated voltage battery value, VBNL1, is stored. After time T5, the temperature of the battery is determined by inputting information from thermal sensor 26 (FIG. 2). The temperature value is stored and used to adjust the voltage readings for temperature effects. The time periods from T3 to T5 comprise a third portion of time for testing the battery.

The applicants have discovered that the condition of a battery can be accurately and quickly determined by comparing various combinations of the voltage and current measurements stored during the battery test.

FIGS. 8–12 are flow charts describing the program stored in read only memory 260 which enables the apparatus to conduct the above-described battery test and to analyze the results. In order to begin the test, the apparatus displays on face 235 of display monitor 234 the alpha numeric characters shown in FIG. 13. FIG. 13 illustrates a request for the operator to enter the voltage rating of the battery (6 volts or 12 volts). As soon as the data is entered from keyboard 242, the operator presses the proceed button on the keyboard, and the system displays the alpha numeric characters shown in FIG. 14. FIG. 14 illustrates the voltage data entered by the operator and requests the entry of the cold crank ampere rating of the battery. As soon as the cold crank rating has been entered from the keyboard, the operator presses the proceed button on the keyboard, and the battery test commences as shown in FIG. 8.

In step S10, the initial battery voltage, VBO, is read from voltage measurement circuit 30, converted to digital form by converter 126 and stored in memory 258 under the supervision of CPU 252. In step S11, the processor system transmits a load signal over bus DB to relay controller 168 (FIGS. 1 and 6) which enables the appropriate ones of load resistors 135–141 to apply a 140 amp electrical load to battery 10, thereby removing surface charge. In step S12, the load is maintained on the battery for a period of time in seconds equal to the cold crank amperes rating entered by the operator (FIG. 14) divided by 18.2. In step S13, the relay controller 168 opens relay contacts 145–147 in order to remove the load resistors from the battery at time T1 (FIG. 7). In step S13, there is a delay of forty seconds before the charge removed voltage, VBLL, is stored in step S14 at time T2. For 12 volt batteries, value VBLL is stored directly in memory 258. For 6 volt batteries, VBLL is multiplied by two before it is stored.

In step S15, the processor system transmits a charge signal over bus DB to relay controller 168 which enables contact 162 (FIG. 2) to close, thereby charging the battery for 3 seconds. At the end of the charge cycle (prior to time T3), the charging voltage VBC and charging current IBC are stored in steps S16 and S17. Six volt battery values are stored in accordance with the equations opposite steps S16 and S17 in FIG. 8. If the charging current is less than zero, there is an error in the test, and the procedure is halted in step S19. If the charging current is not less than zero, relay contact 162 is opened, thereby terminating the charging of the battery according to steps S18 and S20.

At times T3, according to steps S23–S25, an appropriate electrical load is applied to the battery depending on its voltage rating. According to these steps, the appropriate contacts from the group consisting of 145–148 (FIG. 2) are closed in order to draw 70 amps from a 6 volt battery and 100 amps from a 12 volt battery. As soon as the load is applied (at time T3), the discharging voltage and currents, VBHL1 and IBHL1, are stored in memory 258. For six volt batteries, the values are altered before storage according to the equations located to the right of step S26 in FIG. 9. If IBHL1 is less than zero, there is an error in the procedure, and the test is halted in step S28. If the current reading is proper, three more pairs of discharging voltage and current readings are taken at five second intervals in step S29 (VBHL2, IBHL2; VBHL3, IBHL3; and VBHL4, IBHL4, respectively). These values are also adjusted for 6 volt batteries according to the equations opposite step S26. After the discharging is completed in fifteen seconds (i.e., at time T4), the electrical load resistors are removed in step S30 by opening the appropriate contacts from among 145–148. As soon as the discharge from the battery has decreased to less than 5 amps, the terminated voltage, VBNL1, is stored in step S32. For 6 volt batteries, the value is altered according to the equation appearing to the right of step S32.

In step S33, processor system 250 determined whether temperature sensor 26 is defective. If so, the battery parameter of temperature is set to 25° C. in step S33D. If sensor 26 is not defective, the output voltage produced by the temperature measurement circuit 110, is converted to digital form by converter 126, and the temperature in degrees centigrade is determined from a look-up table stored in memory. If the temperature of the battery is too hot or too cold, as determined by steps S35–S38, the program returns to a sub-routine (not disclosed) which informs the operator that the battery is outside the temperature range for testing. If the battery is in the proper temperature range, the system delays 30 seconds in step S40 (FIG. 10), and then stores the second terminated voltage VBNL2 in step S41 at time T5. The voltage voltage is altered for 6 volt batteries as indicated by the equation to the right of step S41. The voltage temperature correction factors are computed as described in step S42. This is an important step which enables the following battery condition criteria to accurately determine the condition of the battery.

In steps S43-S71 (FIGS. 10-12), the processor system determines the condition of the battery with a degree of accuracy previously unobtainable based on a number of new test criteria. These test criteria are summarized in the following table A:

TABLE A

Figure 10:
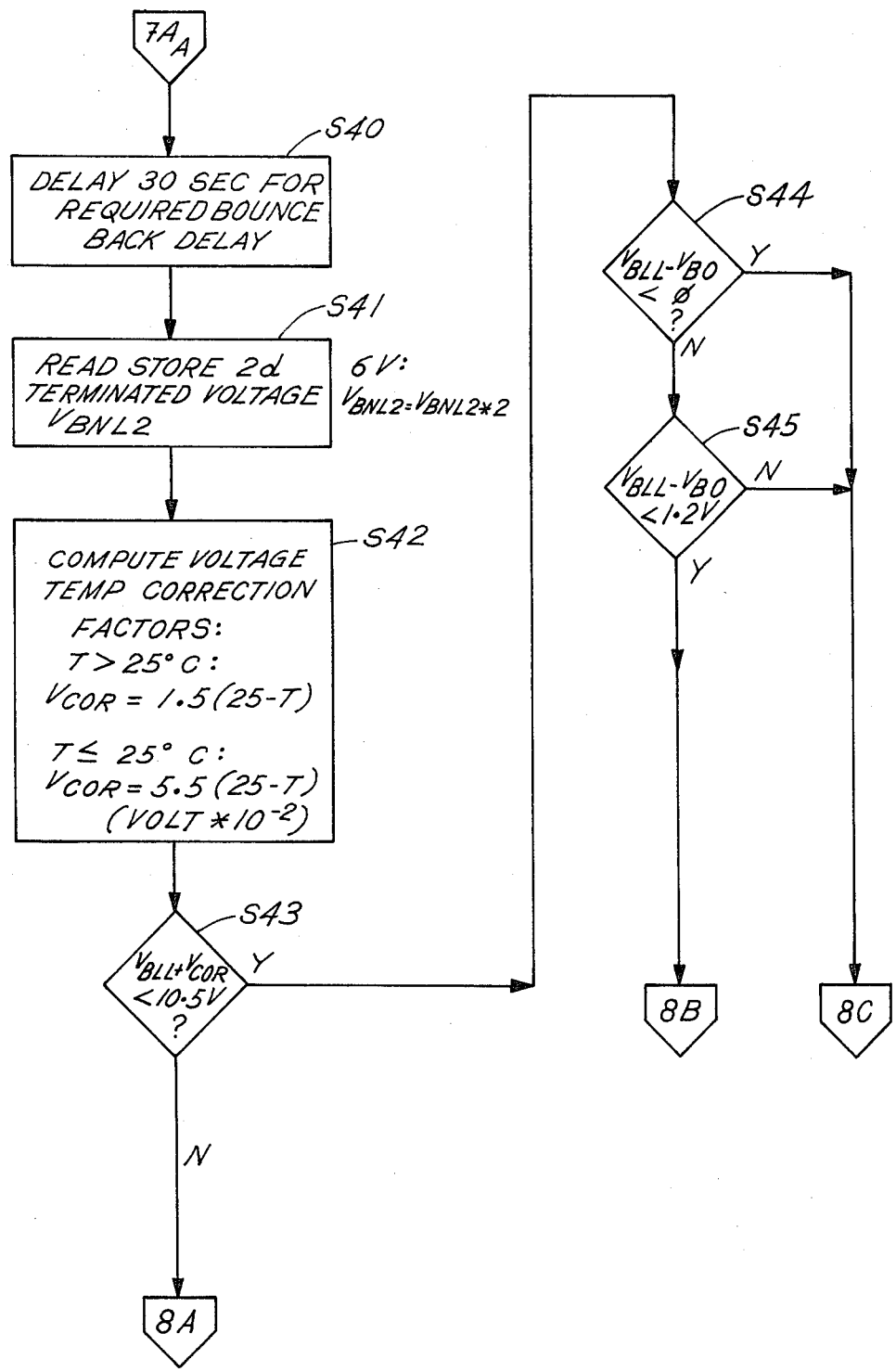

Battery Defective If:
1. $V_{BLL} < 10.5$ AND $0 < V_{BLL} - V_{BO} < 1.2$
2. $10.5 < V_{BLL} < 12.3$ AND $R_x < 200$ m$\Omega$
3. $V_{BLL} > 12.3$ AND $V_{BHL4} < 10.9$
4. $V_{BLL} > 12.3$ AND $V_{BHL4} > 10.9$ AND $V_{BC} > 13.6$
5. $V_{BLL} > 12.3$ AND $V_{BHL4} > 10.9$ AND $V_{BC} < 13.6$ AND $R_x > 13$m$\Omega$
6. $V_{BLL} > 12.3$ AND $V_{BHL4} > 10.9$ AND $V_{BC} < 13.6$ AND $V_{BLL}-V_{BNL2} > 1.25$
7. $V_{BLL} > 12.3$ AND $V_{BHL4} > 10.9$ AND $V_{BC} < 13.6$ AND CHARGE ACCEPTANCE IMPROPER Battery Good If:
1. $V_{BLL} > 12.3$ AND $V_{BHL4} > 10.9$ AND $V_{BC} < 13.6$ AND $R_x < 10$m$\Omega$ AND $V_{BLL}-V_{BHL2} < 1.25$ AND CHARGE ACCEPTANCE IS PROPER The temperature correction factor VCOR has been omitted from Table A in order to simplify the other test criteria. The first test criteria is evaluated in steps S43-S45 (FIG. 10).

In step S46, the processor computes the battery percent of charge according to the following equation:

$$\% \text{ Charge} = (V_{BLL} + 0.17 * (25 - T) - 1195) * 1.25 = Cl$$

Depending on the battery test mode and the percent of charge, as determined in steps S47 and S48, the charge-removed battery voltage $V_{BLL}$ is again compared to a predetermined voltage in step S49. If that temperature-corrected voltage is not greater than or equal to 12.3 volts, the internal resistance of the battery is calculated in step S50 according to the following equations:

$$R_1 = \frac{V_{BNL1} - V_{BHL4}}{I_{BHL4}}$$

$R_c = R_1 - 0.0127*(37 - Cl)$ if $Cl < 30$;
$= R_1 - 0.0028*(70 - Cl)$ if $30 \leq Cl < 70$;
$= R_1$ if $Cl \geq 70$
$R_S = R_C + 0.0018*(CCA - 330)$ where $CCA$ is cold crank amp rating of battery
$R_X = R_S + 0.00331*(T - 25)$ if $T > 25°$ C.;
$= R_S + 0.02*(T - 25)$ if $T \leq 25°$ C.

In the foregoing equations, Cl = the percent charge of the battery calculated in step S46.

In step S51, the second criteria from Table A is determined. This is an important criteria which states that if the charge-removed battery voltage is between certain limits, the battery should have an internal resistance greater than 200 milliohms, or it is defective. This criteria is contrary to the conventional wisdom taught by the battery art in which low battery internal resistance is deemed to be a virtue in all cases. The applicants have discovered that this is not necessarily true.

Step S52 determines whether criteria 3 of Table A is met, and step S53 determines whether criteria 4 of Table A is met.

In the event the battery is found to be discharged in steps S54 and S56, the processor enables the display shown in FIG. 15. In response to the FIG. 15 display, the operator must charge and retest the battery by pressing the proceed button on keyboard 252.

Figure 11:
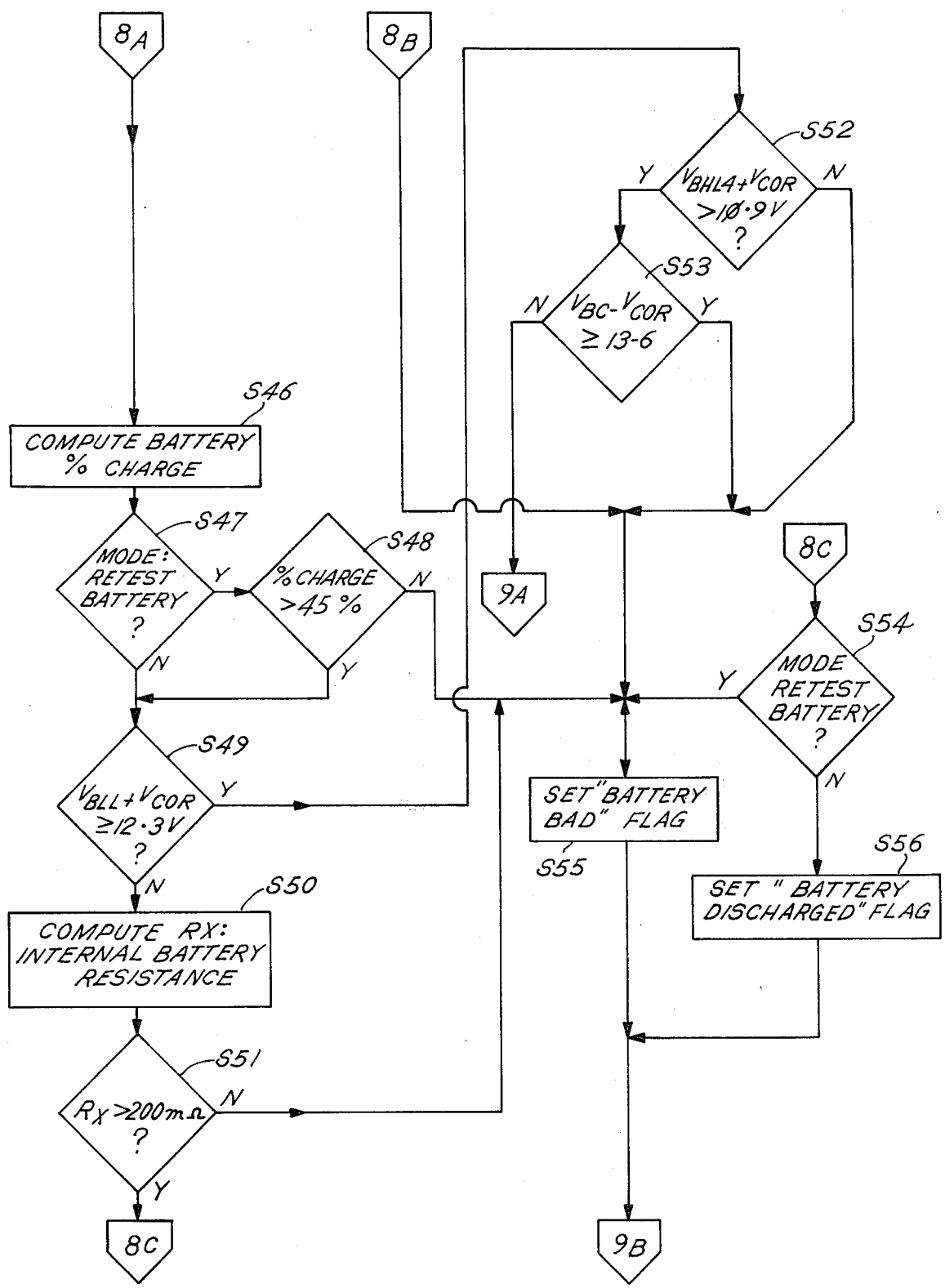

In the event that the battery is found to be defective by any of the foregoing test criteria, the processor transmits an analysis signed on bus DB to controller 232 which enables display monitor 234 to indicate the display shown in FIG. 16. The operator is not only informed that the battery is bad, but also is informed about the charge level. This display results from setting the "battery bad" flag in step S55 (FIG. 11).

Figure 12:
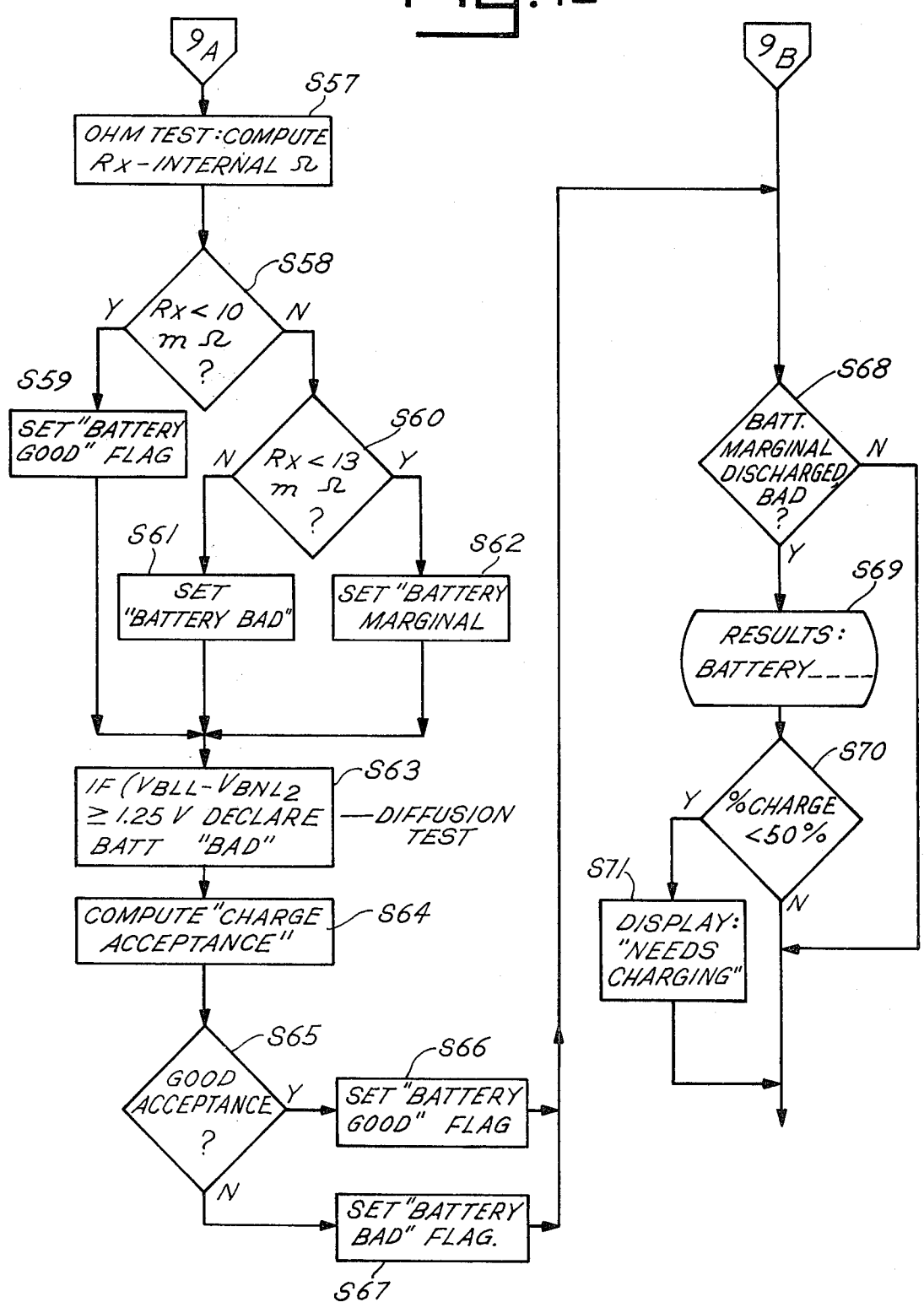

In the event that the battery passes the criteria of step S49, the internal resistance of the battery is not computed until step S57 (FIG. 12). Step S57 is carried out in the same manner as step S50 described above. Steps S58-S62 complete criteria 5 of Table A in the manner indicated in FIG. 12. They also complete the battery good criteria 1 shown in Table A. However, as shown in step S63, even if the "battery good" flag is set in step S59, the "battery bad" flag may be immediately reset if the battery does not pass the diffusion test described in step S63. If the diffusion test is failed, the battery is defective as indicated by criteria 6 in Table A. In addition to the diffusion test, the battery also must pass the "charge acceptance" test described in step S64. Charge acceptance is calculated according to the following equation:

| To Pass ($V_{BC} - V_{BLL}$) *80 $\leq$ KCA* (60 + $1_{BC}$) | | | | | | | | | |
|---|---|---|---|---|---|---|---|---|---|
| Where KCA = | 100 | 121 | 143 | 167 | 192 | 219 | 247 | 277 | 318 | 341 |
| | if | if | if | if | if | if | if | if | if | if |
| T = | +25° C. | +20 | +15 | +10 | +5 | 0 | −5 | −10 | −15 | −20° C. |

The charge acceptance test completes criteria 7 shown in Table A. Depending on the results of this test, the "battery good" flag or the "battery bad" flag is set in steps S66 or S67. In the battery test is good, the processor enables display monitor 234 to indicate the display shown in FIG. 17. Other displays indicating that the battery is marginal or needs charging are enabled by steps S68-S71.

Those skilled in the art would be able to prepare a detailed program listing from the foregoing flow charts. Preparation of a detailed listing is within the skill of the art, and one example of such a listing for a computer-controlled engine testing device as shown in the above-identified Cashell et al Patent.

Although a single embodiment has been described in the specification, those skilled in the art would be able to make modifications and alternations within the scope of the invention as defined by the appended claims.

What is claimed is:

1. In a system for testing a battery having an internal impedance, improved apparatus for determining and displaying the condition of the battery comprising:

converter means for generating digital battery parameter values corresponding to parameters of the battery at different points in time;

loading means for placing an electrical load on the battery in response to a load signal;

charging means for charging the battery in response to a charge signal;

display means for indicating the condition of the battery in response to an analysis signal; and processor means for generating the load signal during part of a first portion of time thereby electrically loading the battery, generating the charge signal during part of a second portion of time following the first portion of time to enable the charging of the battery, generating the load signal during part of a third portion of time following the second portion of time thereby electrically loading the battery, storing a first battery parameter value generated by the converter means during a part of the first portion of time when the load signal is absent and the battery therefore is unloaded, storing a second battery parameter value generated by the converter means during a part of the third portion of time when the load signal is present and the battery therefore is loaded, calculating the condition of the battery based on at least the first and second stored parameter values, and generating an analysis signal, so that the condition of the battery is displayed by the display means.

2. Apparatus, as claimed in claim 1, wherein the battery parameter values are battery voltage values.

3. Apparatus, as claimed in claim 2, wherein the processor means comprises means for storing an initial battery voltage value during a predetermined first time period within the first portion of time when the battery is unloaded, generating the load signal to place the load on the battery during a predetermined second time period within the first portion of time so that surface charge is removed from the battery, enabling the removal of the load from the battery during a predetermined third time period within the first portion of time, storing a charge-removed battery voltage value sensed during the third time period, generating the charge signal to enable the charging of the battery during said second portion of time, generating the load signal to place the load on the battery during a predetermined fourth time period within the third portion of time, storing a plurality of battery discharging voltage values sensed during the fourth time period, enabling the removal of the load from the battery during a predetermined fifth time period within the third portion of time, storing a terminated voltage battery value sensed during the fifth time period, and calculating the condition of the battery based at least in part on some of the stored values, so that the condition of the battery is accurately determined.

4. Apparatus, as claimed in claim 3, wherein the processor means comprises means for causing the second predetermined time period to be proportional to the cold-crank rating of the battery.

5. Apparatus, as claimed in claim 3, wherein the processor means comprises means for storing at least one battery discharging current value sensed during the fourth time period and calculating the internal resistance of the battery based at least in part on at least one of the battery discharging voltage values, terminated voltage value and discharging current value.

6. Apparatus, as claimed in claim 3, wherein the processor means comprises means for calculating the percent of charge of the battery based at least in part on the chargeremoved battery voltage value.

7. Apparatus, as claimed in claim 3, wherein the processor means comprises means for calculating the condition of the battery based at least in part on the charge-removed voltage value and the initial battery voltage value.

8. Apparatus, as claimed in claim 5, wherein the processor means comprises means for calculating the condition of the battery based at least in part on the charge-removed voltage value and the internal resistance.

9. Apparatus, as claimed in claim 3, wherein the processor means comprises means for calculating the condition of the battery based at least in part on the charge-removed battery voltage value and at least one of the battery discharging voltage values.

10. Apparatus, as claimed in claim 9, wherein the processor means further comprises means for storing a battery charging voltage value sensed during the second portion of time and calculating the condition of the battery further based on the battery charging voltage value.

11. Apparatus, as claimed in claim 10, wherein the processor means comprises means for storing at least one battery discharging current value sensed during the fourth time period, calculating the internal resistance of the battery based at least in part on the battery discharging voltage value, terminated voltage value and discharging current value, and calculating the condition of the battery further based on the internal resistance.

12. Apparatus, as claimed in claim 10, wherein the processor means further comprises means for calculating the condition of the battery further based on the terminated battery voltage value.

13. Apparatus, as claimed in claim 10, wherein the processor means comprises means for calculating the condition of the battery further based on the charge acceptance of the battery.

14. Apparatus, as claimed in claim 3, wherein the battery parameter values include battery temperature and wherein at least the charge-removed battery voltage is corrected for variations in battery temperature.

15. In a method for testing a battery having an internal impedance, improved steps for determining and displaying the condition of the battery comprising:

generating digital battery parameter values corresponding to parameters of the battery at different points in time;

placing an electrical load on the battery in response to a load signal; charging the battery in response to a charge signal;

indicating the condition of the battery in response to an analysis signal;

generating the load signal during part of a first portion of time thereby electrically loading the battery;

generating the charge signal during part of a second portion of time following the first portion of time to enable the charging of the battery;

generating the load signal during part of a third portion of time following the second portion of time thereby electrically loading the battery;

storing a first battery parameter value during a part of the first portion of time when the load signal is absent and the battery therefore is unloaded;

storing a second battery parameter value during a part of the third portion of time when the load signal is present and the battery therefore is loaded;

calculating the condition of the battery based on at least the first and second stored parameter values; and generating an analysis signal, so that the condition of the battery is displayed.

16. A method, as claimed in claim 15, wherein the battery parameter values are battery voltage values.

17. A method, as claimed in claim 16, and further comprising the steps of:

storing an initial battery voltage value during a predetermined first time period within the first portion of time when the battery is unloaded;

generating the load signal to place the load on the battery during a predetermined second time period within the first portion of time so that surface charge is removed from the battery;

enabling the removal of the load from the battery during a predetermined third time period within the first portion of time;

storing a charge-removed battery voltage value sensed during the third time period;

generating the charge signal to enable the charging of the battery during said second portion of time;

generating the load signal to place the load on the battery during a predetermined fourth time period within the third portion of time;

storing a plurality of battery discharging voltage values sensed during the fourth time period;

enabling the removal of the load from the battery during a predetermined fifth time period within the third portion of time;

storing a terminated voltage battery value sensed during the fifth time period; and calculating the condition of the battery based at least in part on some of the stored values, so that the condition of the battery is accurately determined.

18. A method, as claimed in claim 17, and further comprising the step of causing the predetermined second time period to be proportional to the cold-crank rating of the battery.

19. A method, as claimed in claim 17, and further comprising the steps of:

storing at least one battery discharging current value sensed during the fourth time period; and calculating the internal resistance of the battery based at least in part on at least one of the battery discharging voltage values, terminated voltage value and discharging current value.

20. A method, as claimed in claim 17, and further comprising the step of calculating the percent of charge of the battery based at least in part on the charge-removed battery voltage value.

21. A method, as claimed in claim 17, and further comprising the step of calculating the condition of the battery based at least in part on the charge-removed battery voltage value and the inital battery voltage value.

22. A method, as claimed in claim 19, and further comprising the step of calculating the condition of the battery based at least in part on the charge-removed battery voltage value and the internal resistance.

23. A method, as claimed in claim 17, and further comprising the step of calculating the condition of the battery based at least in part on the charge-removed battery voltage value and at least one of the battery discharging voltage values.

24. A method, as claimed in claim 23, and further comprising the steps of:

storing a battery charging voltage value sensed during the second portion of time; and calculating the condition of the battery further based on the battery charging voltage value.

25. A method, as claimed in claim 24, and further comprising the steps of:

storing at least one battery discharging current value sensed during the fourth time period;

calculating the internal resistance of the battery based at least in part on the battery discharging voltage value, terminated voltage value and discharging current value; and calculating the condition of the battery further based on the internal resistance.

26. A method, as claimed in claim 24, and further comprising the step of:

calculating the condition of the battery further based on the terminated voltage value.

27. A method, as claimed in claim 24, and further comprising the step of calculating the condition of the battery further based on the charge acceptance of the battery.

28. A method, as claimed in claim 17, wherein the battery parameter values include battery temperature and wherein at least the charge-removed battery voltage is corrected for variations in battery temperature.

* * * * *